United States Patent [19]
Ikeda et al.

[11] Patent Number: 5,691,995
[45] Date of Patent: Nov. 25, 1997

[54] TRANSMISSION OF DATA BY USING CONVOLUTIONAL CODING OF DIFFERENT CODE RATES AND THE ENCODED DATA RECEPTION INCLUDING DECODING OF THE RECEIVED DATA

[75] Inventors: Yasunari Ikeda, Kanagawa; Tamotsu Ikeda, Tokyo; Takahiro Okada, Chiba, all of Japan

[73] Assignee: Sony Corporation, Tokyo, Japan

[21] Appl. No.: 416,204

[22] Filed: Apr. 4, 1995

[30] Foreign Application Priority Data

Apr. 5, 1994 [JP] Japan ..................... 6-066997

[51] Int. Cl.$^6$ ................................. H03M 13/12
[52] U.S. Cl. ......................................... 371/43
[58] Field of Search ............... 371/43; 375/261, 375/265

[56] References Cited

U.S. PATENT DOCUMENTS

| | | | |
|---|---|---|---|
| 5,052,000 | 9/1991 | Wang et al. | 371/43 |
| 5,197,061 | 3/1993 | Halbert-Lassalle et al. | 370/11 |
| 5,214,656 | 5/1993 | Chung et al. | 371/43 |
| 5,287,374 | 2/1994 | Parr | 371/43 |
| 5,305,352 | 4/1994 | Calderbank et al. | 375/261 |
| 5,307,377 | 4/1994 | Chouly | 375/261 |
| 5,384,809 | 1/1995 | Yagi et al. | 375/261 |
| 5,394,439 | 2/1995 | Hemmati | 375/242 |
| 5,438,590 | 8/1995 | Tzukerman et al. | 375/259 |
| 5,442,626 | 8/1995 | Wei | 370/20 |

FOREIGN PATENT DOCUMENTS

| | | |
|---|---|---|
| 0 490 552 | 6/1992 | European Pat. Off. . |
| 0 634 840 | 1/1995 | European Pat. Off. . |
| 42 29 654 | 4/1993 | Germany . |
| 2 238 933 | 6/1991 | United Kingdom . |

OTHER PUBLICATIONS

Clark et al., "Error–Correction Coding for Digital Communications", Plenum Press, P. 10, Jan. 1981.

IEEE Global Telecommunications Conference Globecom '92, Orlando, US, 06.–09.12.1992, vol. 2, 6 Dec. 1992, IEEE, New York US pp. 707–711, XP357655 D.C. Linne Von Berg/S.G. Wilson: 'Improved Concatenated Coding/Decoding for Deep Space Probes.'

European Transactions on Telecommunications and Related Technologies vol. 4, No. 3, May 1993, Milano IT pp. 277–283, XP385754 P. Cremonesi/R. Pellizzoni/A. Spalvieri/E. Biglieri: 'An Adjustable–Rate Multilevel Coded Modulation System: Analysis and Implementation'.

(List continued on next page.)

*Primary Examiner*—Stephen M. Baker
*Attorney, Agent, or Firm*—William S. Frommer; Alvin Sinderbrand

[57] ABSTRACT

A transmission system for transmitting information series such as hierarchically coded image data etc. includes at least one transmission apparatus and receiving apparatus. The transmission apparatus has an encoder and a multiplexor. The encoder takes a plurality of information series from a single information source as input, utilizes convolutional coding to code the plurality of inputted information series, and carries out code processing in such a manner that at least one of the plurality of inputted information series is coded with a code rate differing from that of the remaining information series. The higher the priority of the information series, the lower the code rate of the encoding. The multiplexor multiplexes a plurality of convolutional code series outputted from the encoder. The transmission apparatus modulates and transmits an output from the multiplexor. The receiving apparatus has a demultiplexor and a decoder. The demultiplexor demultiplexes received data and outputs a plurality of convolutional code series. The decoder decode-processes the plurality of convolutional code series outputted from the demultiplexor.

15 Claims, 6 Drawing Sheets

OTHER PUBLICATIONS

IEEE International Conference on Communications, Geneva, CH, 23.–26.05.1993, vol. 3, 23 May 1993, IEEE, New York, US pp. 1785–1790 P.G.M. De Bot/S. Baggen/A. Chouly/A. Brajal: 'An Example of a Multi–Resolution Digital Terrestrial TV Modem'.

Signal Processing. Image Communication, vol. 4, No. 4–5, Aug. 1992, Amsterdam NL pp. 283–292, XP293749 K.M. Uz/K. Ramchandran/M. Vitterli: 'Combined multiresolution source coding and modulation for digital broadcast of HDTV'.

TRANSMISSION OF DATA BY USING CONVOLUTIONAL CODING OF DIFFERENT CODE RATES AND THE ENCODED DATA RECEPTION INCLUDING DECODING OF THE RECEIVED DATA

BACKGROUND OF THE INVENTION

1. Field of the Invention

The present invention relates to a transmission apparatus, receiving apparatus and accompanying transmission system and method, and particularly relates to a transmission apparatus, receiving apparatus and accompanying transmission system and method for transmitting digital data.

2. Description of the Related Art

When digital data, for example, is being transmitted, error correction processing is carried out to take into consideration transmission errors occurring in the transmission path, with convolutional code or block code such as, for example, Reed-Solomon code etc. usually being used as the code for error correction processing, i.e. the error correction code.

Transmission errors are propagated to the decode processes on the receiving side and rigorous countermeasures must be carried out with respect to these errors.

When transmission systems using wireless circuits such as, for example, satellite circuits as the transmission path are employed, transmission errors occur particularly easily because the level of the signal received at the receiving station is low and the C/N (Carrier to Noise Ratio) is therefore small. With, for example, transmission systems employing ground waves, regions in the proximity of the boundary of the service area of these ground waves have a low received signal level so that transmission errors occur particularly easily, as in the case for satellite circuits.

When digital data is transmitted using wireless circuits such as satellite circuits, error correction processing involving convolutional coding is carried out after coding into convolutional codes such as the aforementioned Reed-Solomon codes. The resulting error correction-processed digital data is modulated using a transmission method employing, for example, QPSK (Quadratic Phase Shift Keying).

When the code rate of the convolutional code on the receiving side is made small in this kind of transmission system, information is added for error correction within the transmission data. However, although this makes the error correction performance high, the throughput of the apparatus becomes small and the code rate and transmission efficiency therefore becomes inferior. The code rate referred to here is K/n in the case where the bit number of convolutional code obtained by convolutionally coding K bit data is taken to be n.

On the other hand, when the code rate of the convolutional code is made large, the throughput of the apparatus becomes large and high performance coding can be carried out but the error correction performance falls.

As a result of the above, the code rate of the convolutional code is decided taking into consideration both the convolutional code rate and the error correction performance.

The level of the signal received on the receiving side in transmission systems employing satellite circuits fluctuates greatly depending on the weather conditions. This can be attributed to radio waves being absorbed by clouds and rain. The level of the signal received on the receiving side in transmission systems employing satellite circuits also differs depending on the size of the receiving antenna.

Further, with transmissions using ground waves, the level of the received signal is large in regions (areas) which are near the receiving side but the level of the received ground wave signal is small in regions going away from the transmission side.

Usually, the code rate of the convolutional code is decided so as to obtain a prescribed error correction performance at a prescribed signal receiving level. However, if the received signal level becomes small due to the kind of deterioration in the environmental conditions described above and the C/N worsens, transmission errors occur due to the error correction performance being exceeded and these errors are carried over into other portions, causing fatal damage to the data.

Figure 1:
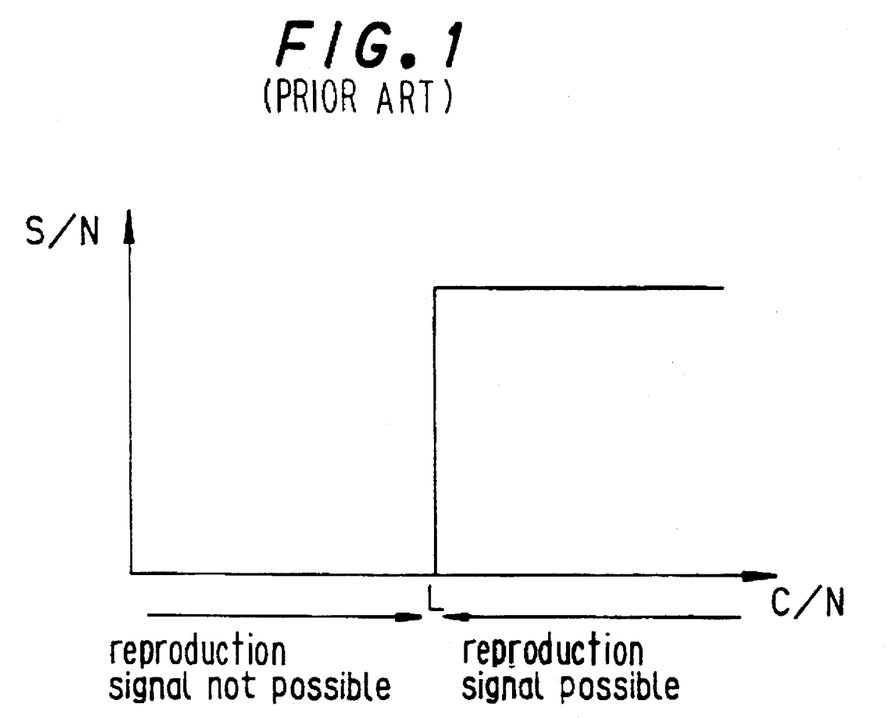
FIG. 1 is a view showing the image S/N occurring in television broadcasts using conventional satellite broadcasts and the received signal C/N.

More specifically, let the case of television broadcasts using satellite broadcasts be considered. As shown, for example,, in FIG. 1, when the received signal C/N at, for example, a usual household on the receiving side is above a prescribed threshold value L, it is error-free, i.e. when the S/N (signal to noise ratio) of the television broadcast image data or audio data is decided by the coding method on the transmission side, a prescribed level is maintained and the image data and/or audio data can be perceived. However, if the received signal C/N is smaller than a prescribed threshold value, it is not possible to carry out transmission error correction. As a result of this, the television broadcast S/N abruptly falls and can no longer be watched or listened to at all.

This is to say that rather than changing proportionally with the received signal C/N, the S/N of the television broadcast image data and audio data on the receiving side deteriorates abruptly when the received signal C/N becomes smaller than a prescribed threshold value L and it will suddenly not be possible to see or hear the television broadcast.

Therefore, in the case where the received signal C/N gradually falls from a value above the prescribed threshold value L, rather than having a television broadcast which had been viewable suddenly disappear, it would be preferable if the television broadcast could still be viewed even if the S/N slightly deteriorates.

SUMMARY OF THE INVENTION

It is therefore an object of the present invention to provide a transmission apparatus which resolves the above-mentioned problem.

It is another object of the present invention to provide a receiving apparatus which resolves the above-mentioned problem.

It is a further object of the present invention to provide a transmission system which resolves the above-mentioned problem.

It is yet another object of the present invention to provide a transmission method which resolves the above-mentioned problem.

According to the present invention, there is to be provided a transmission apparatus including a coding part, multiplexing part and transmitting part. The coding part employs convolutional coding to code a plurality of inputted information series and carries out code processing with a code rate for at least one information series of said plurality of inputted information series differing from other information series code rates. The multiplexing part multiplexes a plurality of convolutional code series. The transmission part modulates and transmits an output from the multiplexing means.

According to the present invention, there is to be provided a receiving apparatus. The receiving apparatus employs convolutional coding to code a plurality of inputted information series, carries out code processing in such a manner that at least one of the plurality of inputted information series is coded with a code rate differing from code rates for the other information series, and receives transmission data multiplexed from a plurality of convolutional code series, which is then transmitted. The receiving apparatus comprises a receiving part, a demultiplexor and a decoding part. The receiving part receives transmitted transmission data. The demultiplexor demultiplexes received data from the receiving part and outputs a plurality of convolutional code series. The decoding part decode-processes the plurality of convolutional code series outputted from the demultiplexor. The decoding part halts outputting of a decoding output when it is determined that an uncorrectable error has occurred amongst the plurality of convolutional code series.

According to the present invention, there is to be provided a transmission system including at least one transmission apparatus and at least one receiving apparatus. The transmission apparatus includes a coding part and a multiplexing part. The coding part employs convolutional coding to code a plurality of inputted information series and carries out code processing with a code rate for at least one information series of the plurality of inputted information series differing from code rates for other information series. The multiplexing part multiplexes a plurality of convolutional code series outputted from the coding part. The transmission part modulates and transmits an output from the multiplexing part. The receiving part receives transmitted data transmitted by the transmission part and is comprised of a demultiplexor and a decoding part. The demultiplexor demultiplexes received data from the receiving part and outputs a plurality of convolutional code series. The decoding part decode-processes the plurality of convolutional code series outputted from the demultiplexor.

According to the present invention, there is to be provided a transmission apparatus including a coding part, a multiplexing part and a transmission part. The coding part takes a plurality of information series from a single information source as input, utilizes convolutional coding to code the plurality of inputted information series, and carries out code processing in such a manner that at least one of the plurality of inputted information series is coded with a code rate differing with other information series code rates. The coding part codes high priority information series at a low code rate. The multiplexing part multiplexes a plurality of convolutional code series. The transmission part modulates and transmits an output from the multiplexing part.

According to the present invention, there is provided a transmission system including at least one transmission apparatus and receiving apparatus. The transmission apparatus has an encoder and a multiplexor. The encoder takes a plurality of information series from a single information source as inputs, utilizes convolutional coding to code the plurality of inputted information series, and carries out code processing in such a manner that at least one of the plurality of inputted information series is coded with a code rate differing from code rates for other information series. The encoder codes high priority information series at a low code rate. The multiplexor multiplexes a plurality of convolutional code series outputted from the encoder. The transmission apparatus modulates and transmits an output from the multiplexor. The receiving apparatus receives transmitted data transmitted by the transmission apparatus. The receiving apparatus has a demultiplexor and a decoder. The demultiplexor demultiplexes received data from the receiving apparatus and outputs a plurality of convolutional code series. The decoder decode-processes the plurality of convolutional code series outputted from the demultiplexor.

According to the present invention, there is to be provided a transmission method. In this transmission method, convolutional coding is employed to code a plurality of inputted information series and code processing is carried out in such a manner that at least one of the plurality of inputted information series is coded with a code rate differing from code rates for other information series, a code-processed plurality of convolutional code series are multiplexed and transmitted, transmitted transmission data is received, received data is demultiplexed and decoded into a plurality of coded information series and a decode process is carried out for each of the coded information series.

According to the present invention, by carrying out code processing in such a manner that a code rate for at least one information series of a plurality of inputted information series differs from code rates for other information series and then transmitting, the information series of the plurality of information series for which the code rate is low can be outputted as the receiving output.

DETAILED DESCRIPTION OF THE PREFERRED EMBODIMENTS

First Embodiment

Figure 2:
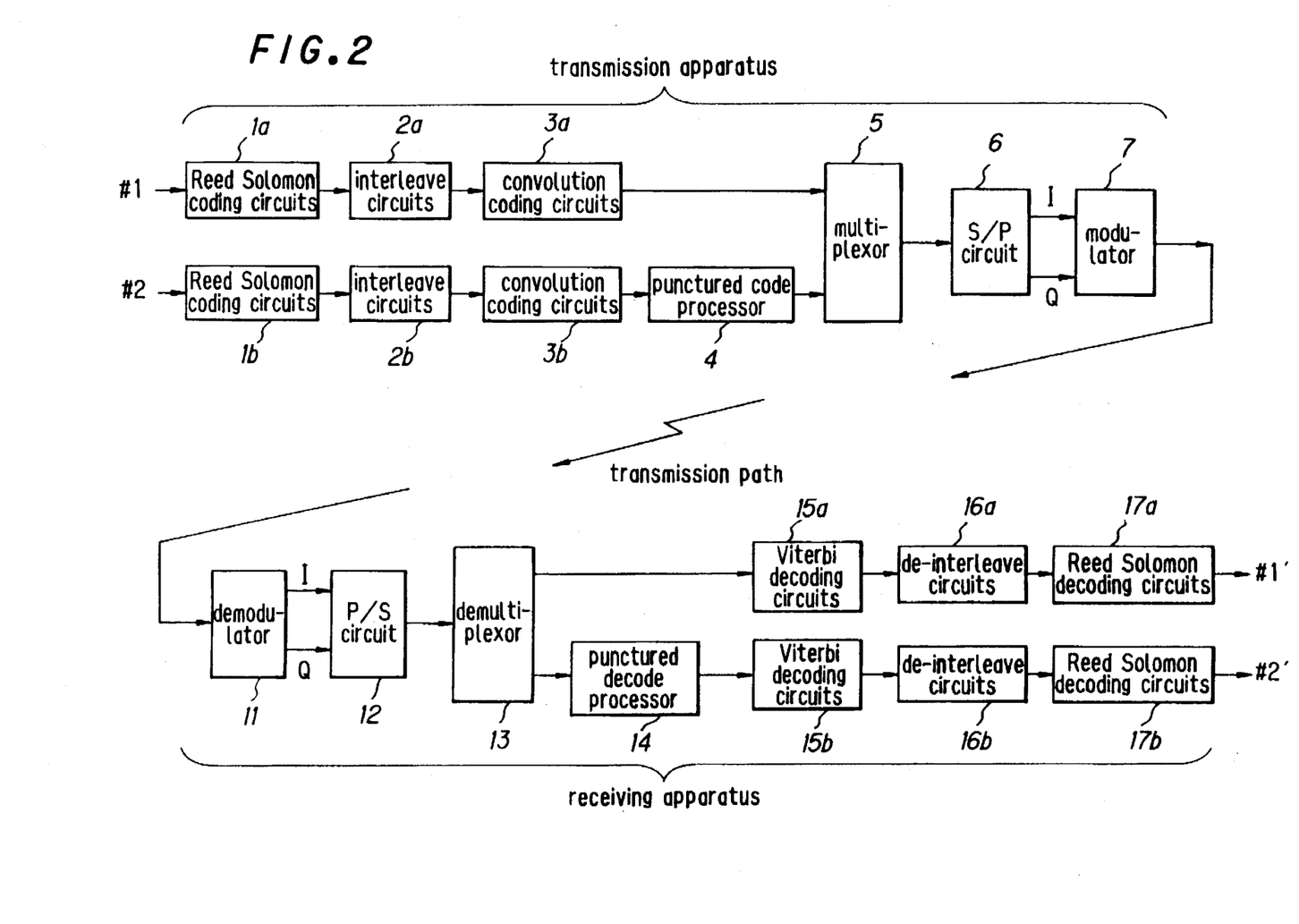
FIG. 2 is a block diagram showing the structure of a transmission system for transmitting image data for a first embodiment of the present invention.

FIG. 2 is a block diagram showing the structure of a first embodiment of the present invention applied to an image transmission system for transmitting digital data taken as image data. This transmission system is constructed from a transmitting apparatus comprising Reed-Solomon coding circuits 1a and 1b, interleave circuits 2a and 2b, convolution coding circuits 3a and 3b, a puncture code processor 4, a multiplexor 5, and S/P (serial/parallel conversion circuit) 6, and a modulator 7, and a receiving apparatus comprising a demodulator 11, a P/S (parallel/serial conversion circuit) 12, a demultiplexor 13, a puncture decode processor 14, Viterbi decoding circuits 15a and 15b, de-interleave circuits 16a and 16b and Reed-Solomon decoding circuits 17a and 17b. In the transmission system shown in FIG. 2, information is transmitted from the transmitting apparatus to the receiving apparatus via a transmission circuit such as, for example, a satellite circuit.

At the Reed-Solomon coding circuits 1a and 1b of the transmitting apparatus, a single information source such as, for example, image data taken as digital data is hierarchically coded at an information source coding circuit not shown in the diagram, so that two input information series are then inputted.

Of the two hierarchically coded input information series for this image data, the input information series which is necessary in the reproduction of the image i.e. the input information series having a high priority or a high degree of necessity is taken as the input information series 1 and the input information series which is not necessary i.e. the low priority input information series is taken as the input information series 2.

The high priority input information for the image data is the lowest amount of information necessary for showing a recognizable image. This is, for example, a low band component of the image data, a low order DCT (Discreet Cosine Transform) coefficient occurring in the MPEG (Moving Picture coding Experts Group) or frame data i.e. I picture, coded within the frame. The unnecessary (low priority) input information is what is known as additional information necessary for improving the picture quality i.e. information for improving image resolution. This is, for example, high-band component image data, high order DCT coefficients occurring in MPEG or coded frame data i.e. P or B pictures, occurring between frames etc.

The kind of input information series #1 and #2 above are inputted to Reed-Solomon coding circuits 1a and 1b respectively. The Reed-Solomon coding circuits 1a and 1b Reed-Solomon code the input information series #1 and #2 and send outputs to the interleave circuits 2a and 2b, respectively. The interleave circuits 2a and 2b interleave the outputs of the Reed-Solomon coding circuits 1a and 1b in prescribed interleave block units and send outputs to the convolution coding circuits 3a and 3b.

The convolution coding circuits 3a and 3b convolutionally code the outputs of the interleave circuits 2a and 2b at a prescribed code rate, for example, ½ etc., and provide this to the multiplexor 5 and the puncture code processor 4 respectively. The puncture code processor 4 carries out the process known as puncturing for thinning out data of the code data convolutionally coded at a prescribed code rate (for example, ½ etc.) outputted from the convolution coding circuit 3b. The puncture code rate is set higher than the source code rate (for example, a code rate of ½ is made to be ¾ etc.) and an output is sent to the multiplexor 5.

The multiplexor 5 multiplexes the convolutional code data provided from the convolution coding circuit 3a using, for example, time divided multiplexing, for the convolutional code data, coming from the convolution coding circuits 3a and 3b via the puncture code processor 4, and outputs this to the S/P circuit 6.

The S/P circuit 6 gathers the multiplex data sequentially provided in one bit units from the multiplexor 5 together into data of 2-bit units (parallel signals). Two bit data for these single units is then taken as the signals I or Q respectively and outputted to the modulator circuit 7. The modulator 7 then modulates the signal I or Q outputted from the S/P circuit 6 using a carrier wave having, for example, a prescribed frequency or a phase difference of only ¶/2 and these are then synthesized, i.e. the output of the S/P circuit 6 is QPSK modulated at the modulator 7 and sent to a transmission circuit such as, for example, a satellite circuit etc. via an antenna which is not shown in the diagram.

At the signal receiving apparatus, radio waves from the signal transmitting apparatus are received at an antenna not shown in the diagram via a satellite circuit, with this received signal being provided to the demodulator 11.

The demodulator 11 carries out QPSK demodulation on the received signal by performing multiplication on items which are the same as the two carrier waves i.e. two carrier waves having a phase difference of 90 degrees, at the modulator 7 and the demodulator 11 outputs the resulting signals I and Q to the P/S circuit 12. The P/S circuit 12 outputs the signal pair I and Q from the demodulator 11 to the demultiplexor 13 in one-bit units. The demultiplexor 13 then separates and decodes the output of the P/S circuit 12 into data corresponding to the input information series 1 and 2, and outputs these respectively to the Viterbi decoding circuit 15a and the puncture decode processor 14.

The puncture decode processor 14 carries out puncture decoding processing on the data i.e. code data coded at a code rate of ¾ by the puncture code processor 4, from the multiplexor 13 and outputs this to the Viterbi decoding circuit 15b.

The Viterbi decoding circuits 15a and 15b perform decoding based on Viterbi algorithms corresponding to the code rate at the convolution coding circuits 3a and 3b on the inputted data. The Viterbi decoding circuits 15a and 15b output the decoded data on which an error correction process using Viterbi decoding has been carried out to the deinterleave circuits 16a and 16b. The de-interleave circuits 16a and 16b de-interleave the decoded data of the Viterbi decoding circuits 15a and 15b using blocks which are the same as the interleave blocks for the interleave circuits 2a and 2b and send outputs to the Reed-Solomon decoding circuits 17a and 17b, respectively.

The Reed-Solomon decoding circuits 17a and 17b Reed-Solomon decode the respective outputs of the de-interleave circuits 16a and 16b. Information series #1' and #2' corresponding to the input information series #1 and #2 obtained from these results are then provided by the Reed-Solomon decoding circuits 17a and 17b to an information source decoding circuit taken as a signal playback apparatus which is not shown in the drawings. The image data is then hierarchically decoded at the information source decoding circuit from the output information series #1' and #2' and outputted to a monitor not shown in the drawing.

The input information series #1 taken as the high priority data and the input information series #2 taken as the low priority data of the image data from the information source coding circuit are Reed-Solomon coded at the Reed-Solomon coding circuits 1a and 1b of the transmission signal apparatus of the transmission system having the above construction. Data coded by the coding circuits 1a and 1b is then provided to the convolution coding circuits 3a and 3b, respectively, via the interleave circuits 2a and 2b.

The data coded by the Reed-Solomon coding circuits 1a and 1b provided via the interleave circuits 2a and 2b is convolutionally coded at a code rate of, for example, ½ at the convolution coding circuits 3a and 3b. The convolutional code data obtained from these results is provided to the multiplexor 5 and the puncture code processor 4, respectively.

A portion of the coded data convolutionally coded at a code rate of ½ outputted from the convolution coding circuit 3b is shortened in the aforementioned way and put into convolutional code data form at a code rate of ¾.

In this way, the code rate of the convolutional code data based on the input information series #2 from the convolution coding circuit 3b can be raised from ½ to ¾. Both of the input information series 1 and 2 from the information source coding apparatus may be compared with the case for where the code rate for the convolutional code data is ½, showing that it becomes possible to raise the throughput of the transmission apparatus. In this case, if just the input information series #2 is observed, the throughput can be raised by 50%.

The code data convolutionally coded at a code rate of ½ outputted from the convolution coding circuit 3a and the code convolutionally coded at a code rate of ¾ outputted from the puncture code processor 4 are multiplexed at the multiplexor 5 and outputted to the S/P circuit 6. The data multiplexed by the multiplexor 5 is converted into the aforementioned signals I and Q at the S/P circuit 6 and outputted to the modulator 7. A carrier wave is modulated at the modulator 7 based on the I and Q signals from the S/P circuit 6 and this modulated signal is transmitted to a satellite circuit in the transmission path.

The modulated signal transmitted to the satellite circuit via a transponder for a broadcast satellite or a communications satellite is received by the receiving antenna and is provided to the demodulator 11. The received signal is QPSK demodulated in the above-mentioned way at the demodulator 11. This demodulated output of the demodulator 11 is then provided to the demultiplexor 13 via the P/S circuit 12 where it is separated and decoded into convolutional code data for which the code rate is ½ corresponding to the high-priority input information series #1 and convolutional code data for which the code rate is ¾ corresponding to the low-priority input information series #2.

The convolutional code data of the plurality of data outputted from the demultiplexor 13 for which the code rate is ½ corresponding to the high-priority input information series #1 is provided to the Viterbi decoding circuit 15a and the convolutional code data for which the code rate is ¾ corresponding to the low-priority input information series 2 is provided to the puncture decode processor 14.

Appropriate processing known as interpolation processing i.e. puncture decode processing, is carried out by the puncture decode processor 14 on the code data which is convolutionally coded at a code rate of ¾. In this way, the code rate is made to be ½ of the source code rate i.e. the code rate when outputting from the convolution coding circuit 3b, and is outputted to the Viterbi decoding circuit 15b.

The respective code data from the demultiplexor 13 and the puncture decode processor 14 convolutionally coded at a code rate of ½ is Viterbi decoded at the Viterbi decoding circuits 15a and 15b and the resulting error-corrected decoded data is outputted to the Reed-Solomon decoding circuits 17a and 17b, respectively, via the de-interleave circuits 16a and 16b.

Decoded data Provided from the Viterbi decoding circuits 15a and 15b via the de-interleave circuits 16a and 16b is Reed-Solomon decoded at the Reed-Solomon decoding circuits 17a and 17b. The resulting output information series #1 and #2, as shown in the drawing mentioned previously, are then hierarchically decoded into image data at an information source decoding circuit and displayed on a monitor which is not shown in the drawings.

The code convolutionally coded at a code rate of ½ outputted from the puncture decode processor 14 is obtained by interpolating the code data convolutionally coded at a coding efficiency of ¾. This is then compared with the code data convolutionally coded at a code rate of ½ inputted at the Viterbi decoding circuit 15a and this error rate, i.e. the performance of the error correction, deteriorates (i.e. the transmission efficiency becomes high, as described above).

On the other hand, with regards to the same error rate, the C/N required of the code data convolutionally coded at a rate of ½ obtained using convolutional coding is compared with the code data convolutionally coded at a code rate of ¾ obtained using puncture code processing i.e. the C/N required of the code convolutionally coded at a code rate of ½ obtained via puncture decode processing, and can be seen to be in the region of about 2.5 dB lower.

Therefore, even if the received signal C/N attains a level for which accurate error correction cannot be carried out on the convolutional code data (items corresponding the information input series #2 for which the priority is low) from the puncture decode processor 14 at the Viterbi decoding circuit 15b i.e. accurate error correction can be carried out for the convolutional code data i.e. items corresponding to the high-priority input information series #1, from the demultiplexor 13 at the Viterbi decoding circuit 15a to a level approximately 2.5 dB down from this level.

Figure 3:
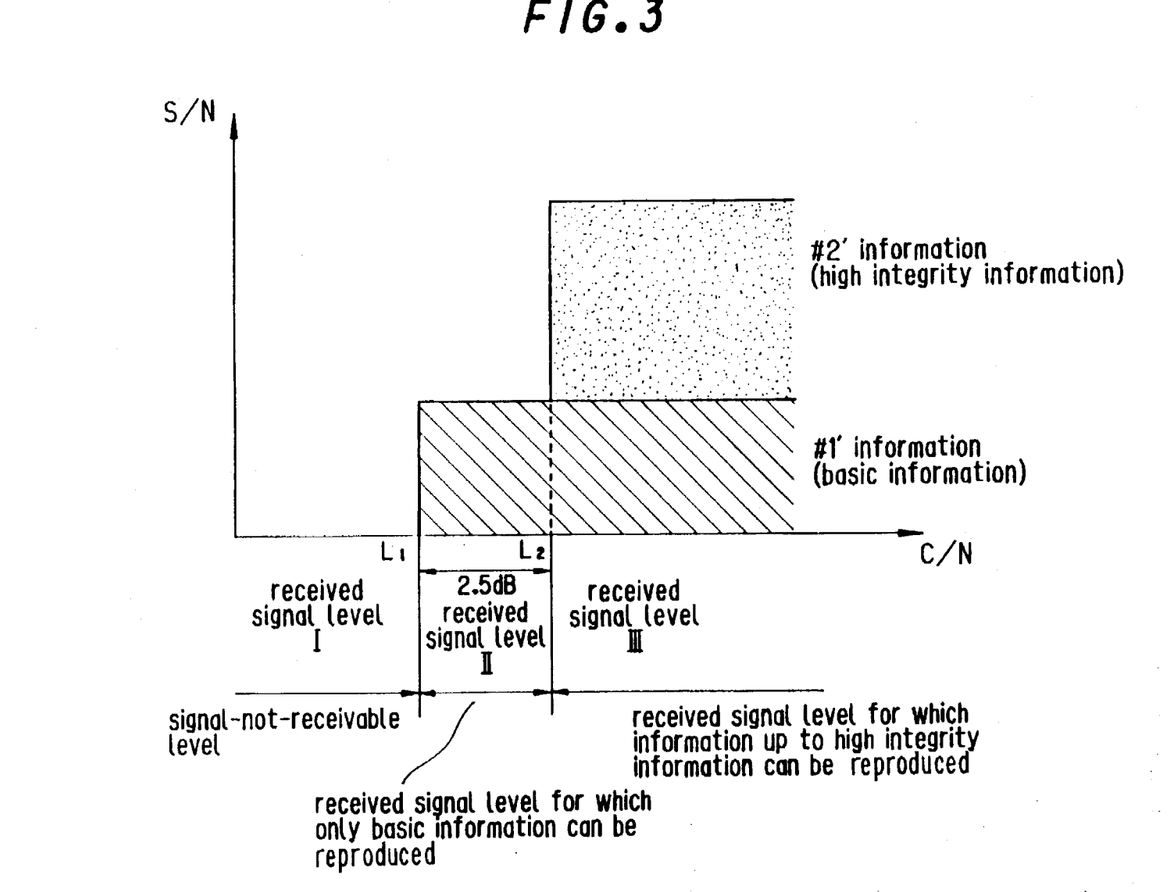
FIG. 3 is a view showing the relationship between the C/N of a received signal received at a receiving apparatus of the embodiment in FIG. 2 and the S/N of a decoded image.

In this case, as shown in FIG. 3, when the receiving signal C/N is in a range above the level L2 i.e. the range for received signal level III in FIG. 3, that is to say when the code data convolutionally coded at a code rate of ¾ has the C/N demanded of the puncture decoding processed code data convolutionally coded at a code rate of ½, accurate error correction can be carried out at both of the Viterbi decoding circuits 15a and 15b. The output information series #1' i.e. data which is the same as the input information series #1, present in the minimum amount of basic information necessary for playing back the image, shown by the hatching in FIG. 3, and the output information series #2' i.e. the same as the input information series #2, present in the high integrity information for raising the picture quality of the image, shown by the dotted part of FIG. 3, can be obtained. A high quality image having a high S/N i.e. an S/N obtained using both of the output information series #1 and #2, can also be obtained.

When the received signal C/N is in the received level range II in FIG. 3 where it is smaller than L2, but greater than L1, accurate error correction cannot be carried out at the Viterbi decoder circuit 15b but can be carried out at the Viterbi decoder 15a. Therefore, at the signal receiving apparatus, the output information series #2' cannot be obtained but the output information series #1' can be obtained, S/N is inferior with respect to the aforementioned case i.e. the S/N is obtained using the output information series #1' only, but a recognizable image can be displayed. Here, $L_1$ is the C/N required of convolutional code data of a code rate of ½ and $L_2-L_1$ is in the region of the aforementioned 2.5 dB.

When the C/N of the received signal is smaller than the level L1 i.e. in the received level I range of FIG. 3, accurate error correction cannot be carried out at the Viterbi decoding circuits 15a and 15b and the receiving apparatus cannot receive signals.

According to this transmission system, the abrupt disappearance of a high quality picture which had been being displayed can be prevented when the received signal C/N becomes low.

In this transmission system, the input information series #1 and #2 are multiplexed after having been Reed-Solomon coded, interleaved and convolutionally coded (the input information series #2 is puncture code processed) at the transmission apparatus. These processes can therefore be carried out at lower speeds when compared with the case where these processes (Reed-Solomon coding, interleaving, convolutional coding and puncture code processing) are carried out after the input information series #1 and #2 have been multiplexed. The blocks for carrying out each process can therefore be constructed more cheaply.

The modulated signal sent from the modulator 7 and received by the demodulator 11 therefore has a high bit rate.

The received signals are then demultiplexed at the receiving apparatus, with the resulting plurality of convolutional code data being Viterbi decoded (convolutional code corresponding to the input information series #2 is puncture decoded before being Viterbi decoded), de-interleaved and Reed-Solomon decoded to obtain the output information series #1' and #2'. Each of the processes can therefore be carried out at a low speed when compared with the case where demultiplexing is carried out after these processes (puncture decode processing, Viterbi decoding, de-interleaving and Reed-Solomon decoding) have been carried out, so that the blocks for carrying out these processes can be constructed more cheaply.

The Viterbi decoding circuits 15a and 15b produce or observe an accumulative sum of the electrical noise power of the convolutional code obtained in, for example, a Viterbi decoding process and generate an error to show that correction of the code is not possible when this falls below a prescribed value. Outputting of the Viterbi decoded data from the Viterbi decoding circuits 15a and 15b is then halted until the accumulative sum becomes smaller than a prescribed value.

Only information which has no errors is then provided at the information source decoding circuit which provides the aforementioned output information series #1' and #2'. The information transmission can then be considered to be carried out at a throughput corresponding to the transmission path conditions i.e. transmission error generation conditions, when viewed from this information source decoding circuit. i.e. in the transmission system in FIG. 2, information can be considered to be transmitted at a variable throughput.

Second Embodiment

Figure 4:
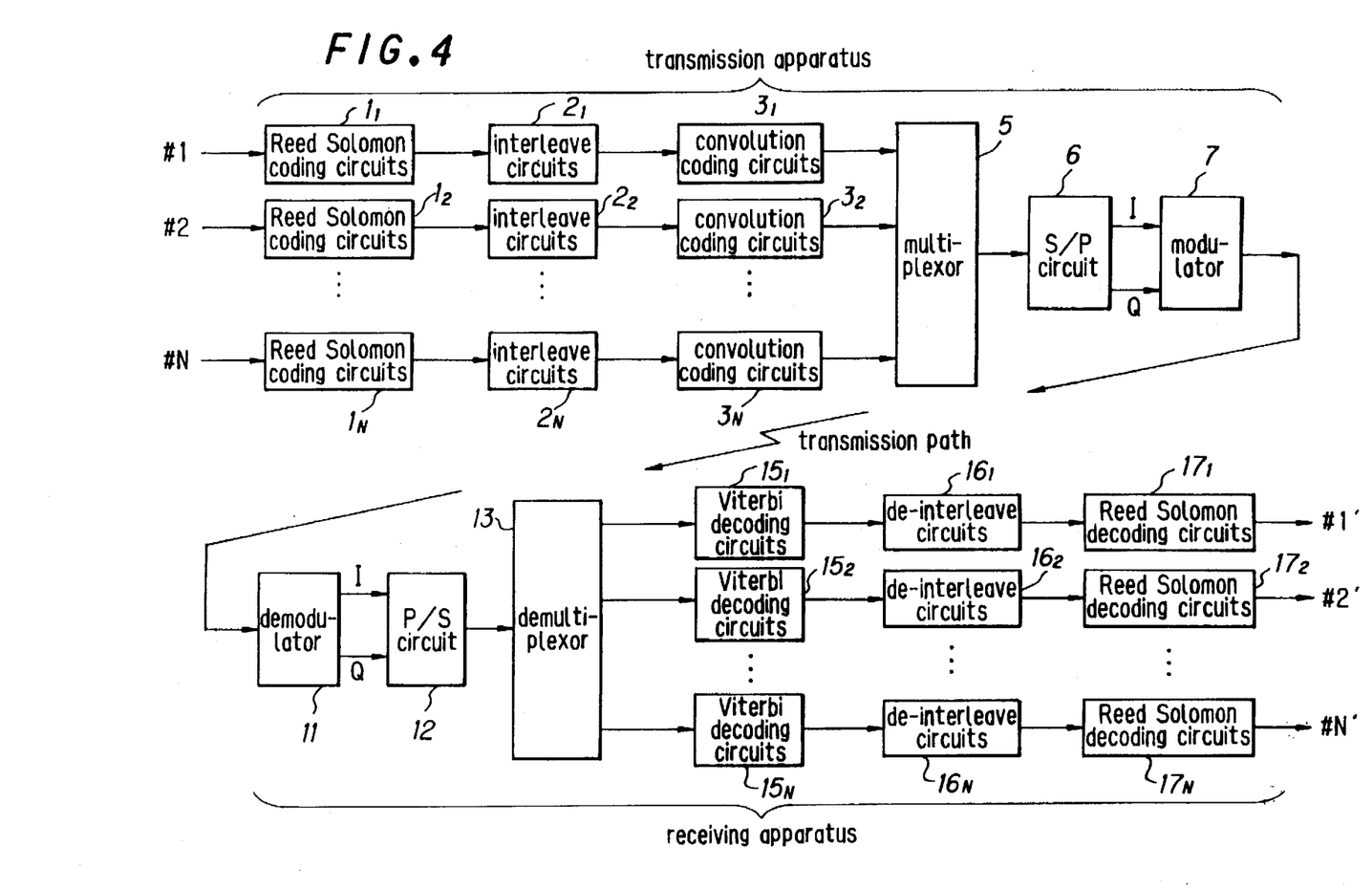
FIG. 4 is a block diagram showing the structure of a transmission system for transmitting image data for a second embodiment of the present invention.

FIG. 4 is a block diagram showing the present invention applied to the structure of a second embodiment of a transmission system for transmitting image data taken as digital data. Portions in FIG. 4 which are common with portions in FIG. 2 have been given the same numerals. In the transmission system of this second embodiment, the structure is the same as for the transmission system of the first embodiment in FIG. 2 except that N Reed-Solomon coding circuits $1_1$ to $1_N$, interleave circuits $2_1$ to $2_N$, convolutional coding circuits $3_1$ to $3_N$, Viterbi decoding circuits $15_1$ to $15_N$, de-interleave circuits $16_1$ to $16_N$ and Reed-Solomon decoding circuits $17_1$ to $17_N$ are provided.

A convolutional coding circuit $3_i$ (i=1, 2, ..., N) convolutionally codes the inputted data at a high code rate when this suffix i is large and at a low code rate when this suffix i is small. Also, a Viterbi decoding circuit $15_i$ performs Viterbi decoding on the data convolutionally coded at the convolutional coding circuit $3_i$ at the code rate at the time of convolutional coding. In the following, the code rate at the convolutional coding circuit $3_i$ and the viterbi decoding circuit $15_i$ is taken to be $R_i$.

In FIG. 4, #1', #2', ..., #N' mean the output information series corresponding to the input information series #1, #2, ..., #N.

The image data is then hierarchically coded into N hierarchical layers at the information source coding circuit, not shown in the drawings, of the transmission system transmission apparatus so that N input information series #1, #2, ..., #N are then inputted.

Items within the N input information series #i (i=1, 2, ..., N) of the hierarchically coded image data for which the suffix i is small are taken to have a high priority. To put this another way, items for which the suffix i is large are given a low priority.

The input information series #i is inputted to the convolutional coding circuit $3_i$ of the receiving apparatus in the transmission system in FIG. 4 via the Reed-Solomon coding circuit $1_i$ and the interleave circuit $2_i$. It is then coded into convolutional code data at the convolutional coding circuit $3_i$ at a code rate $R_i$, and outputted. The N series of convolutional code data outputted from the N convolutional coding circuits $3_i$ are provided to the modulator 7 via the multiplexor 5 and S/P circuit 6. The N series of convolutional code data are then QPSK modulated at the modulator 7. The QPSK modulated signal outputted from the modulator 7 is then transmitted to a broadcasting circuit via an antenna.

Figure 5:
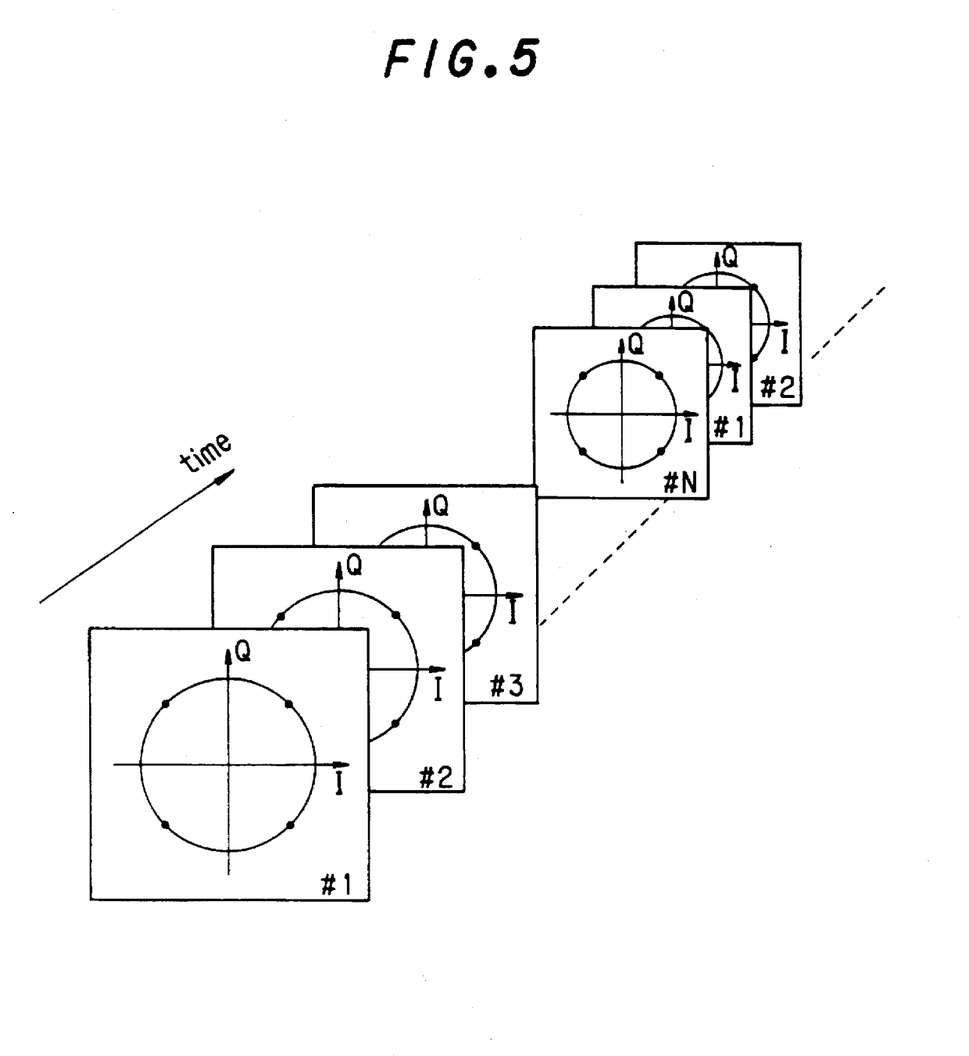
FIG. 5 is a view describing a modulated signal transmitted from the modulator 7 of the embodiment in FIG. 4.

FIG. 5 shows the situation when the QPSK signals corresponding to the N input information series #i are transmitted from the antenna. As shown in FIG. 5, the QPSK signals corresponding to the N information input series #1, #2, ..., #N are sent as a time series. In this case, QPSK modulation is used as the modulation method for every one of each of the time slots occurring in the radio waves from the antenna. The carrier wave for modulating these radio waves on the receiving apparatus side can therefore be easily reproduced.

On the other hand, at the receiving apparatus, radio waves transmitted from the transmission apparatus via a satellite circuit are demodulated by the demodulator 11. This demodulated signal is outputted to the demultiplexor 13 via the P/S circuit 12 and is then decoded into the form of M convolutional code data coded at a code rate $R_i$ at the demultiplexor 13. The code rate $R_i$ coded convolutional code data is then inputted to the Viterbi decoding circuit $15_i$. The convolutional code data coded at a code rate $R_i$ is then Viterbi decoded in accordance with the code rate $R_i$ at the Viterbi decoding circuit $15_i$. Each of the decoded data of the Viterbi decoding circuits $15_1$ to $15_N$ are provided to each of the Reed-Solomon decoding circuits $17_1$ to $17_N$ via the de-interleave circuits $16_1$ to $16_N$. The output information series #1', #2', ..., #N' from the Reed Solomon decoding circuits $17_1$ to $17_N$ are provided to and decoded by the information source decoding circuit and then provided to the monitor after processing. In this way, the decoded image can be displayed on the monitor. In the case of this second embodiment of a transmission system described above also, if high code rate convolutional code data is compared with low code rate convolutional code data, the transmission efficiency is high but the error correction performance is inferior. A large receiving signal C/N is therefore required for items having a high code rate to decode the convolutional code data without errors. On the other hand, decoding can be carried out without errors for a small received signal C/N for convolutionally coded signals having a low code rate.

Figure 6:
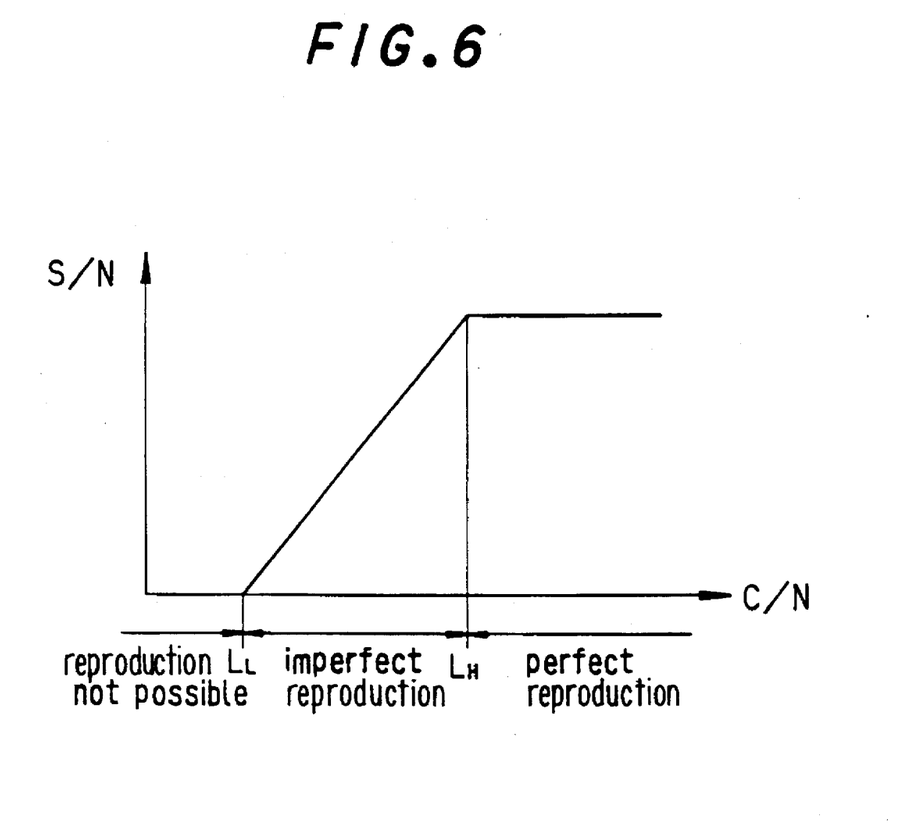
FIG. 6 is a view showing the relationship between the C/N of a received signal received at a receiving apparatus of the embodiment in FIG. 4 and the S/N of a decoded image.

Therefore, at the receiving apparatus, in cases where the C/N of the received signal is greater than the level $L_H$ at which the convolutional code data i.e. convolutional code data of code rate $R_N$, with the highest code rate can be decoded without errors, all of the N series of convolutional code data from the demultiplexor 13 can be accurately decoded and a decoded image of a high picture quality and high S/N can be obtained, as shown in FIG. 6.

Further, as shown in FIG. 6, when the received signal C/N is smaller than the level $L_H$ and greater than the level $L_L$ at which the convolutional code data i.e. convolutional code data of code rate $R_1$, for which the code rate is lowest can be decoded without errors, i.e. a level where convolutional code data of a code rate less than $R_I$ (where I is any integer in the range of 1 to N−1) can be decoded without errors, the items from the N series of convolutional code data from the demultiplexor 13 with code rates $R_1$ to $R_j$ can be accurately decoded. An S/N decoded image corresponding to a number of series for the convolutional code data accurately coded in this way is obtained. A high (low) S/N decoded image is obtained when the number of convolutional code series accurately decoded is large (small).

As shown in FIG. 6, if the received signal C/N is smaller than the level $L_L$, error correction cannot be carried out and receiving is not possible (reproduction is not possible).

According to this second embodiment of a transmission system, when the received signal C/N becomes low, the decoded image S/N deteriorates gradually, as shown in FIG. 6. In actual fact, if the received signal C/N is in the range from the level $L_L$ to $L_H$, the decoded image S/N changes in N steps, i.e. so-called graceful degradation is carried out. This means that the user is spared cases where the S/N of an image which had until recently been displayed at a high picture quality abruptly becomes inferior.

In the above, the case is described where the present invention is applied to the transferring of image data in a transmission system. However, in addition to image data, the present invention may be applied to any apparatus for sending and/or receiving data such as, for example, audio data or other data.

In this embodiment, data was transmitted from the transmitting apparatus to the receiving apparatus via a satellite circuit but in addition to this, wireless circuits such as ground wave lines etc. or wireless lines may also be used.

Further, in this embodiment, just images obtained from a single information source were transmitted. However, information present in information obtained from a plurality of information sources such as, for example, images obtained from an image information source and audio obtained from an audio information source, or images, audio and data obtained from a data information source etc. may be hierarchically coded and transmitted.

For example, when transmitting images and audio, audio can be assigned to high priority data and images can be assigned to low priority data. Further, when the audio data is transmitted as both stereo audio data and monaural audio data, it is possible to assign the monaural audio data to higher priority data than the stereo audio data.

Also, in FIG. 2, the output of the convolution coding circuit 3b outputting code data convolutionally coded at a code rate of ½ is puncture code processed by the puncture code processor 4 and convolutionally coded at a code rate of ¾. However, in addition to this, the puncture code processor 4 may not be set up, and code data convolutionally coded at a code rate of ¾ may be outputted at the convolution coding circuit 3b.

However, if the puncture code processor 4 is set up, the convolution coding circuits 3a and 3b both output code data convolutionally coded at the same code rate of ½. Mass production is therefore possible, and the cost of the apparatus can be reduced accordingly.

Further, in each embodiment, Reed-Solomon coding was used as the block coding but other block codings may also be used.

Also, Viterbi decoding was carried out for the decoding of the convolutional code in each embodiment but decoding may also be carried out using other decoding methods.

Further, reference was not made to the value N in each embodiment but the S/N characteristic of the decoded image for the received signal C/N shown in FIG. 3 or FIG. 6 can be made smooth by making this value N large. However, as shown in FIG. 4, making the value of N large, also makes the apparatus large and increases the cost. It is therefore necessary to decide N by balancing the S/N characteristic of the decoded image, the apparatus scale and the cost.

Still further, as shown in FIG. 4, it is not necessary to make-all of the values for the code rates $R_1$ to $R_N$ for the respective convolutional coding circuits $3_1$ to $3_N$ different.

What is claimed is:

1. A transmission apparatus, comprising:

coding means employing convolutional coding to code a plurality of inputted information series and carrying out code processing with a code rate for at least one information series of said plurality of inputted information series differing from the code rate for the remaining other information series, wherein the coding means is equipped with a plurality of convolutional signal processing parts for carrying out convolutional code processing on each of the plurality of inputted information series and a code processing part for raising the code rate of an output from said at least one of the plurality of convolutional signal processing parts;

multiplexing means for multiplexing a plurality of convolutional code series outputted from the coding means; and transmission means for modulating and transmitting an output from the multiplexing means.

2. A transmission apparatus comprising:

coding means employing convolutional coding to code a plurality of inputted information series and carrying out code processing with a code rate for at least one information series of said plurality of inputted information series differing from the code rate for the remaining other information series, wherein the coding means includes puncture code processing means for carrying out code processing in such a manner that at least one of the plurality of inputted information series is coded with a code rate differing from that for the remaining information series;

multiplexing means for multiplexing a plurality of convolutional code series outputted from the coding means; and transmission means for modulating and transmitting an output from the multiplexing means.

3. A receiving apparatus for receiving a plurality of convolutional code series transmitted by a transmitting apparatus including coding means employing convolutional coding to code a plurality of inputted information series and carrying out code processing with a code rate for at least one information series of said plurality of inputted information series differing from the code rate for the remaining other information series, wherein the coding means is equipped with a plurality of convolutional signal processing parts for carrying out convolutional code processing on each of the plurality of inputted information series and a code processing part for raising the code rate of an output from said at least one of the plurality of convolutional signal processing parts, multiplexing means for multiplexing a plurality of convolutional code series outputted from the coding means, and transmission means for modulating and transmitting an output from the multiplexing means, said receiving apparatus comprising:

receiving means for receiving transmitted transmission data;

a demultiplexor for demultiplexing received data from the receiving means and outputting a plurality of convolutional code series; and decoding means for decode-processing the plurality of convolutional code series outputted from the demultiplexor, wherein the decoding means halts outputting of a decoding output when it is determined that an uncorrectable error has occurred amongst the plurality of convolutional code series.

4. A receiving apparatus according to claim 3, wherein the decoding means is equipped with Viterbi decoding means for carrying out decode processing based on a Viterbi algorithm.

5. A transmission system comprising:
 at least one transmission means including:
  coding means employing convolutional coding to code a plurality of inputted information series and carrying out code processing with a code rate for at least one information series of said plurality of inputted information series differing from the code rate for the remaining other information series, wherein the coding means is equipped with a plurality of convolutional signal processing parts for carrying out convolutional code processing on each of the plurality of inputted information series and a code processing part for raising a code rate of an output from at least one of the plurality of convolutional signal processing parts;
  multiplexing means for multiplexing a plurality of convolutional code series outputted from the coding means; and
  transmission means for modulating and transmitting an output from the multiplexing means; and
 at least one receiving means receiving transmitted data transmitted by the transmission means including:
  a demultiplexor for demultiplexing received data from the receiving means and outputting a plurality of convolutional code series; and
  decoding means for decode-processing the plurality of convolutional code series outputted from the demultiplexor.

6. A transmission system according to claim 5, wherein the decoding means halts outputting of a decoding output when it is determined that an uncorrectable error has occurred amongst the plurality of convolutional code series.

7. A transmission apparatus comprising:
 coding means for taking a plurality of information series from a single information source as input, utilizing convolutional coding to code the plurality of inputted information series, and carrying out code processing in such a manner that at least one of the plurality of inputted information series is coded with a code rate differing from that for the remaining information series, the coding means coding the information series in such a manner that the higher the priority, the lower the code rate;
 multiplexing means for multiplexing a plurality of convolutional code series outputted from said coding means; and
 transmission means for modulating and transmitting an output from the multiplexing means.

8. A transmission apparatus according to claim 7, wherein the coding means is equipped with a first convolutional signal processing part for carrying out convolutional code-processing on high priority information series of the plurality of inputted information series, a second convolutional signal processing part for carrying out convolutional code processing on the remaining information series of the plurality of inputted information series, and a code processing part for carrying out code processing on an output of the second convolutional code processing part for a higher code rate.

9. A transmission apparatus according to claim 7, wherein the coding means is equipped with a first convolutional signal processing part for carrying out convolutional code processing on high priority information series of the plurality of inputted information series, a second convolutional signal processing part for carrying out convolutional code processing on the remaining information series of the plurality of inputted information series, and a puncture code processing part for carrying out code processing on an output of the second convolutional code for a higher code rate.

10. A transmission apparatus according to claim 7, wherein the coding means is equipped with a plurality of convolutional signal processing parts for carrying out convolutional code processing on each of the plurality of inputted information series, the plurality of convolutional signal processing parts carrying out code processing at mutually differing code rates.

11. A transmission system comprising:
 at least one transmission means including:
  coding means taking a plurality of information series from a single information source as input, utilizing convolutional coding to code the plurality of inputted information series and carrying out code processing in such a manner that at least one of the plurality of inputted information series is coded with a code rate differing from that for the remaining information series, the coding means coding said plurality of information series in such a manner that the higher the priority of the information series, the lower the code rate of the encoding; and
  multiplexing means for multiplexing a plurality of convolutional code series outputted from the coding means, wherein the transmission means modulates and transmits an output from the multiplexing means; and
 at least one of receiving means receiving transmitted data transmitted by the transmission means including:
  a demultiplexor for demultiplexing received data from the receiving means and outputting a plurality of convolutional code series; and
  decoding means for decode-processing the plurality of convolutional code series outputted from the demultiplexor.

12. A transmission system according to claim 11, wherein the decoding means halts outputting of a decoding output when it is determined that an uncorrectable error has occurred amongst the plurality of convolutional code series.

13. A transmission method comprising the steps of:
 convolutionally coding a plurality of inputted information series and carrying out code processing with a code rate for at least one information series of said plurality of inputted information series differing from the code rate for the remaining other information series, wherein said code processing includes carrying out convolutional code processing on each of the plurality of inputted information series and raising the code rate for said at least one information series;
 multiplexing and transmitting as data the code-processed plurality of convolutional code series;
 receiving the transmitted data;
 demultiplexing and decoding the received data into a plurality of convolutional code series; and
 carrying out each decode process for a decoded plurality of convolutional code series.

14. A transmission method according to claim 13, wherein outputting of a decoding output is halted when it is determined that an uncorrectable error has occurred amongst the demultiplexed plurality of convolutional code series.

15. A receiving method for receiving a plurality of convolutional code series transmitted by convolutionally coding a plurality of inputted information series and carrying out code processing with a code rate for at least one information series of said plurality of inputted information series differing from the code rate for the remaining other information series, wherein said code processing includes carrying out convolutional code processing on each of the plurality of inputted information series and raising the code rate for said at least one information series, multiplexing and transmitting as data the code-processed plurality of convolutional code series, said receiving method comprising the steps of:

receiving the transmitted data;

demultiplexing the received data and outputting a plurality of convolutional code series; and decode-processing the plurality of convolutional code series.

* * * * *